United States Patent [19]

Eichelberger

[11] 4,070,667
[45] Jan. 24, 1978

[54] CHARGE TRANSFER ANALOG-TO-DIGITAL CONVERTER

[75] Inventor: Charles W. Eichelberger, Schenectady, N.Y.

[73] Assignee: General Electric Co., Schenectady, N.Y.

[21] Appl. No.: 628,401

[22] Filed: Nov. 3, 1975

[51] Int. Cl.² .......................................... H03K 13/02
[52] U.S. Cl. .................... 340/347 NT; 340/347 AD; 340/347 M; 307/221 D; 357/24
[58] Field of Search ................. 340/347 NT, 347 AD, 340/347.5 H; 324/99 D, 111; 357/24; 307/221 C, 221 D

[56] References Cited

U.S. PATENT DOCUMENTS

| 3,368,149 | 2/1968 | Wasserman | 340/347 NT |
|---|---|---|---|
| 3,414,807 | 12/1968 | Evans | 340/347 NT |
| 3,439,272 | 4/1969 | Bailey et al. | 340/347 AD X |
| 3,903,543 | 9/1975 | Smith | 357/24 |
| 3,911,560 | 10/1975 | Amelio et al. | 357/24 X |
| 3,913,122 | 10/1975 | Borel et al. | 357/24 |
| 3,925,805 | 12/1975 | Erb | 357/24 |
| 3,927,418 | 12/1975 | Ando et al. | 357/24 |
| 3,930,255 | 12/1975 | Means | 340/347 AD |
| 3,952,325 | 4/1976 | Beale et al. | 357/24 X |

*Primary Examiner*—Thomas J. Sloyan
*Attorney, Agent, or Firm*—Geoffrey H. Krauss; Joseph T. Cohen; Jerome C. Squillaro

[57] ABSTRACT

A charge transfer analog-to-digital converter is described wherein an analog signal is converted to a digital equivalent thereof in a structure suitable to be implemented in MOS form. A dual slope technique is employed wherein the digital output is the ratio between the input signal and a reference signal.

18 Claims, 15 Drawing Figures

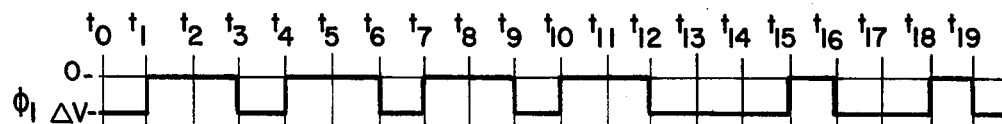
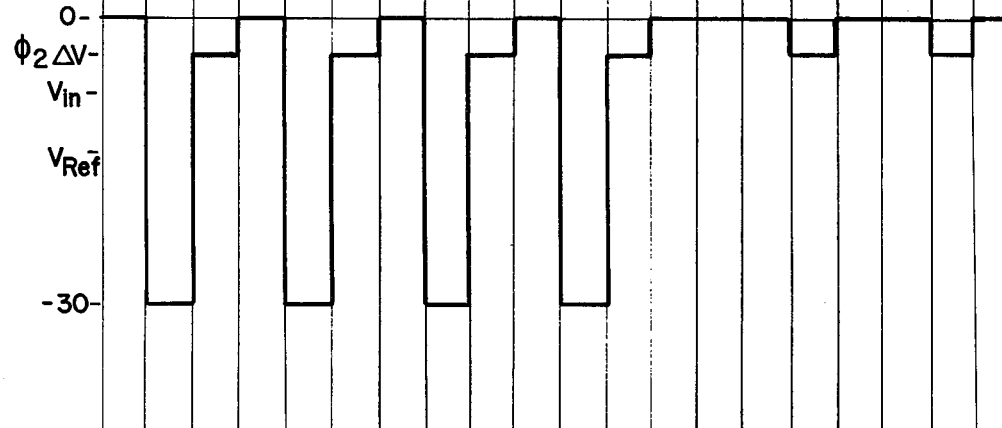
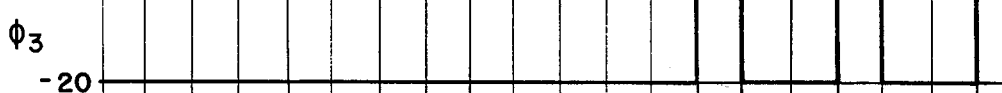
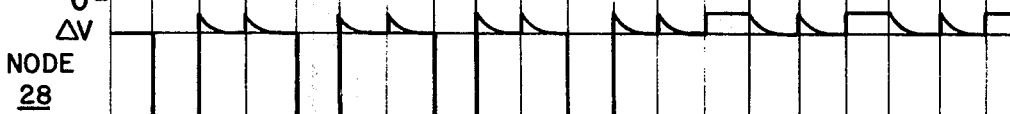
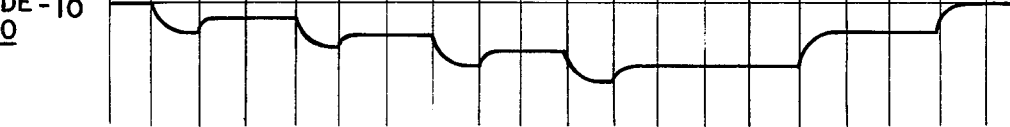

CHARGE TRANSFER ANALOG-TO-DIGITAL CONVERTER

This invention relates, in general, to analog-to-digital converters and more specifically to analog-to-digital converters wherein charge transfer is utilized to effect the conversion process.

The analog-to-digital converter art is especially diverse, and includes a considerable number of different types of analog-to-digital converters. Among the older types of analog-to-digital (A/D) converters are shaft encoders wherein angular motion was converted to digital form. These devices were substantially mechanical and have been recently replaced by solid state A/D converters of a number of types. It has been a feature of analog-to-digital converters in the prior art that they have been complicated devices employing in many instances a large number of precision components, and have, consequently, been rather expensive. For the most part, the expense of an A/D converter has been attempted to be minimized by use of multiplexing techniques wherein a single A/D converter is utilized to measure a large number of distinct signals sequentially. This type of system reduces the cost per measurement while increasing the complexity of the converting system and introducing problems not directly related to the A/D conversion method itself.

A/D converters are becoming ever more important as integrated circuit, and especially microprocessor and microcomputer, technologies advance at ever increasing rates. To the extent that microprocessors and computers require digital inputs, their use in devices wherein parameters are sensed by analog detectors will require analog-to-digital conversion to effect the desired control functions. Those skilled in the art will appreciate that the uses for microprocessors and computers are expanding rapidly in such areas as instrumentation, machine control, appliance control, transportation control, and myriad other applications and potential applications. In order to effectively utilize the advantages of microprocessors and computers, it will be necessary to provide A/D converters compatible with the technology utilized to implement the microcomputers and processors and which analog-to-digital converters are of commensurately low cost with said microprocessors and computers.

It has become apparent that, at least in the near future, microcomputers and processors will be implemented in metal-oxide-semiconductor (MOS) technology, for the most part, and it is desirable therefore that an A/D converter for use in conjunction with these devices be similarly implementable. Insofar as is known, all A/D converters hereinbefore utilized require components which are not susceptible to being fabricated in MOS form. For example, precision resistors are not readily susceptible to being fabricated in MOS form. Similarly, integrators requiring feedback capacitors of fairly substantial capacitance, are difficult or impossible to implement in MOS form.

This invention provides, for the first time, an analog-to-digital converter which obviates the foregoing problems. An analog-to-digital converter in accordance with this invention requires no components which are not readily implementable in MOS form. Further, an A/D converter in accordance with this invention provides the advantages of an integrating A/D converter without the need for a precise time base reference. In fact, the principles of operation of an analog-to-digital converter in accordance with this invention equally well apply to converters operating over arbitrarily long time spans with consequent increased accuracy. Certain embodiments of this invention as will be hereinbelow described are limited in the time during which a conversion must be completed by the recombination of carriers in a particular form of charge storage location. In accordance with one aspect of this invention, a charge storage location is provided which is filled to a preselected level as detected by a suitable detector. Charge is removed from the charge storage location in a metered plurality of substantially equal charge packets. The size of the charge packets is related to the magnitude of the input signal to be meausred. After a preselected number of charge packets has been removed, the second metered plurality of charge packets, the size of each packet being proportional to a reference voltage, is transferred into the charge storage location. The second plurality of charge packets is metered into the charge storage location until the original level thereof is reached. It will be appreciated that the ratio between the number of charge packets in the second plurality and the number of charge packets in the first plurality is equal to the ratio between the signal voltage and the reference voltage. As the metered number of charge packets may be readily counted by digital techniques, a digital output is conveniently provided.

A number of features of this invention insure increased accuracy. For example, in one embodiment of this invention the same means which provides for the removal of said first plurality of charge packets from said charge storage location is utilized to add said second plurality of charge packets to said charge storage location thus obviating the effects of any inaccuracies due to the particular means employed. This invention may be readily implemented in a number of forms including, but not limited to a discrete form wherein discrete capacitors and switches are utilized to effect a charge transfer and charge transfer forms wherein charge storage locations are formed on a semiconductor substrate by any of a number of well known methods therefore including surface charge transfer techniques and bucket brigade delay line techniques. Further, modifications of these basic techniques including the use of buried channels, p-type or n-type semiconductor materials, the use of impurity regions to conduct from one charge storage location to another or the use of overlapping gate structures to effect the transfer of charge may readily be employed as desired by one skilled in the art.

The features of the invention which are believed to be novel are pointed out with particularity in the appended claims. The invention itself, however, both as to its organization and method of operation together with further objects and advantages thereof may best be understood by reference to the following description taken in connection with the accompanying drawings wherein:

FIG. 1 is a partial schematic, partial block diagram of a portion of an analog-to-digital converter in accordance with this invention.

FIG. 2 includes waveform diagrams of certain signals occurring in the circuit of FIG. 1 with repsect to time.

Figure 1:
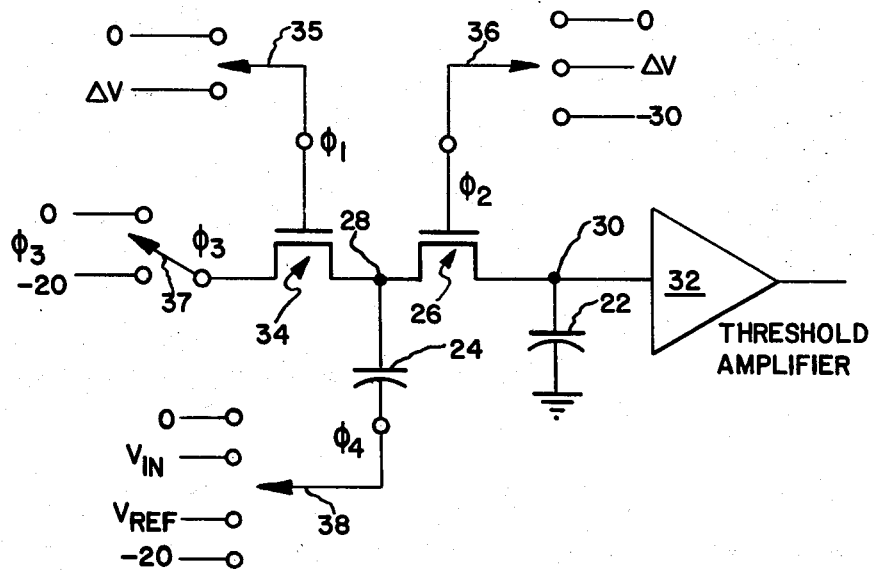

While this invention may be implemented in a number of distinct forms, the invention itself may be most readily understood by referring now to FIG. 1 wherein the invention is illustrated in schematic form. The schematic of FIG. 1 may be readily constructed from discrete components or, if desired, in monolithic integrated form as will be hereinbelow described in conjunction with FIG. 3. FIG. 1 includes only those portions of an analog-to-digital converter in accordance with this invention which are directly involved with the charge transfer processes utilized for the first time in this invention to provide analog-to-digital conversion. Two charge storage locations, which in this case are illustrated as capacitors, but which may, in accordance with this invention, be of any form convenient for the storage and transfer of electrical charge are utilized. As will be hereinbelow described, surface charge storage locations created on the surface of both semiconductor material may readily be employed as well as MOS bucket-brigade type capacitors.

FIG. 1 includes a first capacitor 22 and a second capacitor 24 connected by a semiconductor switch which in this case is an MOS transistor. It is to be understood that transistor 26 might readily be replaced in, for example, a discrete form of an A/D converter in accordance with this invention, by an actual switch or any other means for either permitting or inhibiting the transfer of charge between two charge storage locations known to one skilled in the art. It is preferred in accordance with an exemplary embodiment of this invention that capacitor 22 be larger than capacitor 24 in order that a plurality of charge packets may readily be transferred either into or out of capacitor 22 by successively filling and emptying the charge store location embodied by capacitor 24 For example, as will be more fully discussed hereinbelow, size ratios of 1000 to 1 are usefully employed. Generally, the larger the ratio between capacitor 22 and capacitor 24 or, more accurately, the larger the ratio between the capacity of the charge storage location represented by capacitor 22 and the size of the plurality of charge packets removed from and added to the charge storage location, the greater the resolution of the device. While the size of the charge packets removed from capacitor 22 is not directly controlled by the size of capacitor 24, it will be appreciated, that since the amount of charge is equal to the capacitance times the change in voltage that a smaller capacitance value will made possible larger voltage differentials across the capacitor for the same amount of charge. Therefore, it is convenient in accordance with this invention to utilize a value for capacitor 24 which allows the application of voltages thereto to control the transfer of charge to be compatible with the voltages utilized in the remainder of the A/D converter circuit. For example, logic level voltages as will be hereinbelow described ranging from zero to −20 or −30 volts are conveniently employed.

Those skilled in the art will recognize certain similarities between this invention and the dual slope integrating analog-todigital converters known in the prior art. For example, two parameters are determined in order to define the analog signal level in digital form. The nature of these two parameters, however, differs substantially from the parameters utilized in the dual slope integration technique. In the prior art, it has been known to integrate the unknown analog signal level for a preselected and precisely controlled time and then to integrate a reference voltage in the opposite direction at a predetermined rate in order to obtain two parameters which may be utilized to define the analog signal level in digital form. This invention differs substantially therefrom in that no integrations with respect to time are performed and consequently no precisely controlled time base nor linear integrator is required. The elimination of the necessity for a linear integrator capable of performing precision integration with respect to time is in large measure responsible for the compatibility of an analog-to-digital converter in accordance with this invention with MOS fabrication techniques. Insofar as is known, it has not been possible heretofore to provide a precision integrator with respect to time in MOS form. The fabrication problems associated with the construction of linear resistors and large capacitors make their fabrication in MOS form substantially too costly to be practical. There is no requirement in accordance with this invention that capacitor 22 be linear and therefore its fabrication in MOS form is readily accomplished.

The operation of the analog-to-digital converter in accordance with this invention illustrated at FIG. 1 will be described in conjunction with the waveform diagrams of FIG. 2. While FIG. 2 is illustrated as providing signals to the various terminals of the apparatus of FIG. 1 having a constant repetition rate during each of the two portions of the conversion cycle, it will be appreciated that this invention does not require a particular rate of repetition for the control voltages involved. In fact, the number of charge transfers rather than the time during which they occur or the rate of occurrence is the significant parameter in the conversion process. Therefore, a precisely controlled or particularly stable clock is not required and the rate of conversion may be conveniently chosen based upon other considerations in the utilization of this invention. As will be pointed out, the particular form of implementation of this invention may in certain instances impose restraints upon the selection of the speed of the conversion process. These are restrants in the particular charge transfer fabrication techniques and not constraints due to the nature of the invention.

Referring again to FIG. 1, it will be convenient to describe the operation of this invention in conjunction with the application of the voltage waveforms illustrated at FIG. 2 to the input terminals of this device indicated at $\phi 1$, $\phi 2$, $\phi 3$ and $\phi 4$. FIG. 2 also illustrates the voltages appearing at nodes 28 and 30, respectively. Threshold amplifier 32 provides an output when the voltage at node 30 exceeds a preselected level. Threshold amplifier 32 may conveniently be a Schmitt trigger circuit which changes state when a preselected value is exceeded and reverts to its original state when the voltage at node 30 falls below a second preselected value. Alternately, threshold amplifier 32 may be a sensitive amplifier which itself feeds a comparator of convenient type as will be well known to those skilled in the art. The actual form of threshold amplifier 32 and the associated comparator or Schmitt trigger circuits as required may vary according to the particular method of practicing this invention which is employed. It is preferred, however, that threshold amplifier 32 have a high input impedance so that charge stored in capacitor 22 will not be removed therefrom by the action of threshold amplifier 32. Particular forms of amplifiers suitable for use in accordance with this invention are discussed hereinbelow. Switches 26 and 34 which are illustrated as field effect transistors are operative to connect the various operating voltages to the terminals of capacitors 22 and 24. It will be appreciated that the voltages which are illustrated as being selected by switches 35 through 38 which are associated with phases φ1 through φ4, respectively, may conveniently also be field effect transistors or other semiconductor switches which may be energized by suitable logic circuits as, for example, shift registers. The operation of the charge transfer analog-to-digital converter of FIG. 1 occurs in two substantially distinct measurement phases. At the beginning of the first phase the level of charge in capacitor 22 as represented by the voltage at node 30 is set to be equal to the threshold voltage of threshold amplifier 32. Since the conversion cycle is dependent upon the change in charge rather than any absolute charge magnitude, the threshold of threshold amplifier 32 may be established at any convenient value, but it is preferred that it be repeatable with a high degree of accuracy during a conversion cycle in order that the conversion process be as accurate as possible.

FIG. 2 illustrates the voltage appearing at node 30 and it will be observed that an initial value of -10 volts is indicated at time t0. As was hereinabove described, in accordance with this invention, it is unnecessary that times t0 through t6 be evenly spaced nor that any particular time base be utilized. It is preferred, however, in accordance with this invention that the events illustrated in FIG. 2 occur in the same relationship as illustrated in the figures, that is to say that each of the transitions in the various figures illustrated as taking place at time t1, take place at the same time and, similarly, for the remainder of the times indicated. By way of example, it is intended that the transition illustrated at FIG. 2 (φ1) between ΔV volts and zero volts occur substantially simultaneously with the transition in FIG. 2 (φ2) between zero volts and -30 volts and the transition in FIG. 2 (φ4) between zero volts and -20 volts.

A typical conversion cycle will not be described. As was hereinbefore described, all the values between time t0 and t1 are initialized at the levels indicated and a voltage is present at node 30 as indicated in FIG. 2 equal to the threshold level of threshold amplifier 32. In this case a voltage of -10 volts is illustrated as exemplary. At time t1 φ1 changes from ΔV volts to zero volts turning off transistor switch 34. Simultaneously, φ2 changes from zero volts to -30 volts turning switching transistor 26 on, and φ4 changes from zero volts to -20 volts thus connecting one end of capacitor 24 to -20 volts. φ3 remains at -20 volts throughout this portion of the conversion cycle. During the time interval between t1 and t2, voltage changes occur at nodes 28 and 30 as follows: During the transition occurring in the time t1, the voltage at node 28 decreases rapidly towards a value equal to the change in voltage at φ4. It will be assumed during this discussion that the switching transitions are not instantaneous and, therefore, that the voltage at node 28 will not change by 20 volts but, rather, will approach this value as illustrated at FIG. 2. After the transition is completed the voltage at node 28 will increase towards -11 volts as indicated in FIG. 2, this voltage being intermediate between the -20 volt potential applied to one end of capacitor 24 and the ground potential applied to one terminal of capacitor 22, a series circuit including capacitor 24, transistor switch 26 and capacitor 22 exists, the voltages appearing at the two new nodes being related to the sizes of capacitors 22 and 24 and the resistance of semiconductor switch 26. As the voltages on nodes 28 and 30 change, charge is transferred between capacitors 24 and 22. The amount of charge transferred will be seen to be related to the change in voltages across the two capacitors as will be more completely described hereinbelow. At time t2, φ1 remains at zero volts and consequently transistor switch 34 remains turned off, φ2 rises to ΔV volts, a voltage selected to be slightly greater than the turn-on voltage of transistors 26 and 34. φ3 remains at -20 volts and φ44 switches to the input signal voltage, $V_{in}$. As φ4 rises form -20 volts to $V_{in}$, the voltage at node 28 increases towards zero by a similar amount depending upon the transition time of the waveform at φ4 as was hereinabove described. It is pointed out, however, that the voltage at node 28 does not increase above zero volts to a positive value. Were a positive value to be allowed to exist at node 28, charge would be lost into the substrate of an integrated circuit device constructed in accordance with FIG. 1, through recombination. During the time between t2 and t3 charge is transferred between capacitors 22 and 24 and the voltages appearing at those nodes vary accordingly. Referring specifically to FIG. 2 (node 28), it will be noted that the voltage at node 28 decreases from nearly 0 volts to ΔV at which point switching transistor 26 turns off, there being insufficient voltage applied thereto to maintain conduction. The voltage at node 30 increases from -12 volts to -11 volts. Reviewing the transfers of charge thus far, it will be recalled that initially the voltage appearing across capacitor 24 was ΔV volts and that the voltage just before time t3 appearing across capacitor 24 is ΔV - $V_{in}$ volts and that the net change in voltage across capacitor 24 is therefore equal to $V_{in}$. Since no charge has been transferred except between capacitors 22 and 24, it will be seen that since the amount of charge transferred is equal to the change in voltage ($-V_{in}$) times the capacitance of capacitor 24 that the net charge transfer is directly proportional to $V_{in}$. Since all charge transferred has been transferred between capacitors 22 and 24, the net increase in charge on capacitor 22 is directly proportional to the input signal voltage. At time t3, φ2 increases to zero volts, turning off transistor 26 and isolating capacitor 22 from capacitor 24. φ1 decreases to ΔV volts thus allowing charge to be transferred to capacitor 24 preparatory to the next cycle. φ3 remains at -20 volts in order to supply the requisite charge to capacitor 24 and φ4 increases to zero volts. Thus, at the beginning of the next cycle, occurring at time t4, capacitor 24 is again charge to ΔV volts. Referring to FIG. 2, it will be seen that during the time from t3 to t4 the voltage at node 30 does not change, but that it has decreased from its initial 10 volt value by an amount equal to 1 volt which amount is proportional to the input signal voltage, $V_{in}$. Since this value is less than the threshold of threshold amplifier 32, no output will occur thereat. The change in voltage illustrated at FIG. 2 occuring at node 28 between times t3 and t4 occurs due to the transfer of charge between terminal φ4 and capacitor 24 which is necessary to set the voltage across capacitor 24 at ΔV volts. A second cycle begins at time t4. φ1 changes from ΔV volts to zero volts thus turning off transistor 34. As was the case in the first cycle, turning off transistor 34 substantially isolates capacitors 22 and 24 so that charge may be transferred only between them. At time t4, only φ4 changes from zero volts to −30 volts thus turning on transistor 26. φ3 remains at −20 volts and φ4 changes from zero volts to −20 volts. As φ4 changes, the voltage at node 28 reduces towards −20 volts. Between times t4 and t5, charge is transferred between capacitors 22 and 24 in substantially the same manner as times t1 and t2. The initial voltage appearing at node 30, however, is lower at time t3 than at time t0 by an amount directly proportional to the magnitude of $V_{in}$ as was hereinabove described. Therefore, when charge is transferred during the interval between t4 and t5 the ultimate value of the voltage at nodes 28 and 30 is lower than that reached during the interval between t1 and t2. The amount by which the voltage is lower than that reached during the interval between t1 and t2 is equal to the amount by which the voltage at node 30 during the beginning of the second portion of the cycle is lower than the initial value or threshold value of the threshold amplifier. This value it will be recalled is directly proportional to the magnitude of $V_{in}$. As was the case during the interval between t1 and t2, the final voltage at nodes 28 and 30 rises to a value intermediate −20 volts and ground determined by the respective sizes of capacitors 22 and 24. At time t5, φ1 remains at zero volts thus maintaining transistor 34 in an off condition, φ2 rises from −30 volts to ΔV thus turning transistor 26 on, φ3 remains at −20 volts, and φ4 switches from −20 volts to $V_{in}$. Charge is again transferred between capacitors 22 and 24 until the voltage at node 28 reaches ΔV volts at which time transistor 26 turns off and the voltage across capacitor 22 which appears at node 30 is substantially isolated from the remainder of the circuit. As was the case before the net change in voltage across capacitor 24 is equal to $-V_{in}$, this amount of charge having been transferred to capacitor 22. At time t6, the voltage appearing at node 30 is less than the 10 volt initial value by two volts in the arbitrary scale utilized for the purpose of describing this invention, this change in voltage being directly proportional to the input signal voltage $V_{in}$. FIG. 2 illustrates two further cycles substantially identical to the cycles hereinabove described, the ultimate result of which is that the voltage at node 30 decreases from −10 volts to −14 volts in four cycles. Beginning at time t13, the second phase of the conversion process commences. The first phase of the conversion process has lasted for a preselected number of cycles, in this case four cycles and has resulted in a voltage at node 30 of −14 volts, which voltage is proportional to the magnitude of $V_{in}$. It will be recalled that since the amount of charge transferred into capacitor 22 during each charge transfer cycle was proportional to $V_{in}$ that the final value at node 30 is likewise proportional to $V_{in}$. At time t13, φ1 is at ΔV volts, φ2 is at zero volts, φ3 is at zero volts and φ4 is at $V_{ref}$ the reference voltage. As a consequence, transistor 26 is turned off, transistor 34 is turned on and capacitor 24 is charged to ΔV volts. At time t13, φ3 switches to zero volts and φ4 switches to $V_{ref}$. Transistor 26 remains off and capacitor 22 therefore is isolated from capacitor 24. During the interval between t13 and t14, capacitor 24 is conditioned to remove charge from capacitor 22. The voltage across capacitor 24 is $V_{ref}$. At time t14, φ3 switches from zero volts to −20 volts and the voltage at node 28 decreases to ΔV volts at which time transistor 34 turns off since φ1 is equal to ΔV volts. It will be appreciated that throughout this discussion, it is assumed that transistors 26 and 34 have a threshold voltage of zero volts so that the transistors will turn off when the gate and source voltages are the same rather than when they are separated by a nominal amount. It will be further appreciated that in an actual embodiment of this invention, some threshold voltage would be a characteristic of the transistors selected for switching transistor 26 and 34 and this threshold voltage would slightly alter the waveforms of FIG. 2 and the levels of voltages present thereat rather than in the shape of the waveforms. At time t15, φ1 changes to zero volts turning off transistor 34, φ2 changes to ΔV volts and φ4 changes to 0 volts. Charge is now transferred between capacitors 22 and 24 until the voltage at node 30 is equal to Δ V volts at which point transistor 26 ceases to conduct current between the two capacitors. The net change in voltage across capacitor 24 during the period it is connected with capacitor 22 by transistor switch 26 is $V_{ref}$. The amount of charge actually removed from capacitor 22 is therefore equal to C × $V_{ref}$. During the period between t15 an t16 the voltage at node 30 increases from −14 volts to −12 volts due to the transfer of charge from capacitor 22 to capacitor 24. At time t16, φ1 changes to ΔV volts while simultaneously φ2 changes to zero volts thus turning off transistor switch 26 and isolating capacitors 22 and 24. Capacitor 22 remains at −12 volts and capacitor 24 is once again preconditioned to have a potential at node 28 of ΔV volts via the same two step process as was hereinbefore described. Similarly, an excess of charge is transferred into capacitor 24 by turning on transistor 34 as φ1 goes to ΔV volts at time t16. φ3 is at 0 volts between t16 and t17 while φ4 is at $V_{ref}$. At time t17, φ3 changes to −20 volts and between t17 and t18 charge is transferred from capacitor 24 through switch 34 to φ3 until the voltage reaches ΔV volts at which time transistor 34 ceases to conduct and the desired level is attained. φ1 once again switches to zero volts at time t18 thus isolating capacitor 24 from φ3 and allowing charge to transfer between capacitors 22 and 24. The voltage at node 30 rises until the voltage at node 20 reaches ΔV volts a net change of $V_{ref}$. As will be noted, the voltage at node 30 has risen to the threshold value of threshold amplifier 32 and the conversion process is completed. It will be seen that four transfers were effected during the first portion of the conversion cycle and two were necessary to re-establish the threshold voltage level during the reference portion of the cycle. The ratio between the reference voltage and the input voltage is therefore 2:1 as will be confirmed by reference to the graphical illustrations at FIG. 2.

Figure 3:
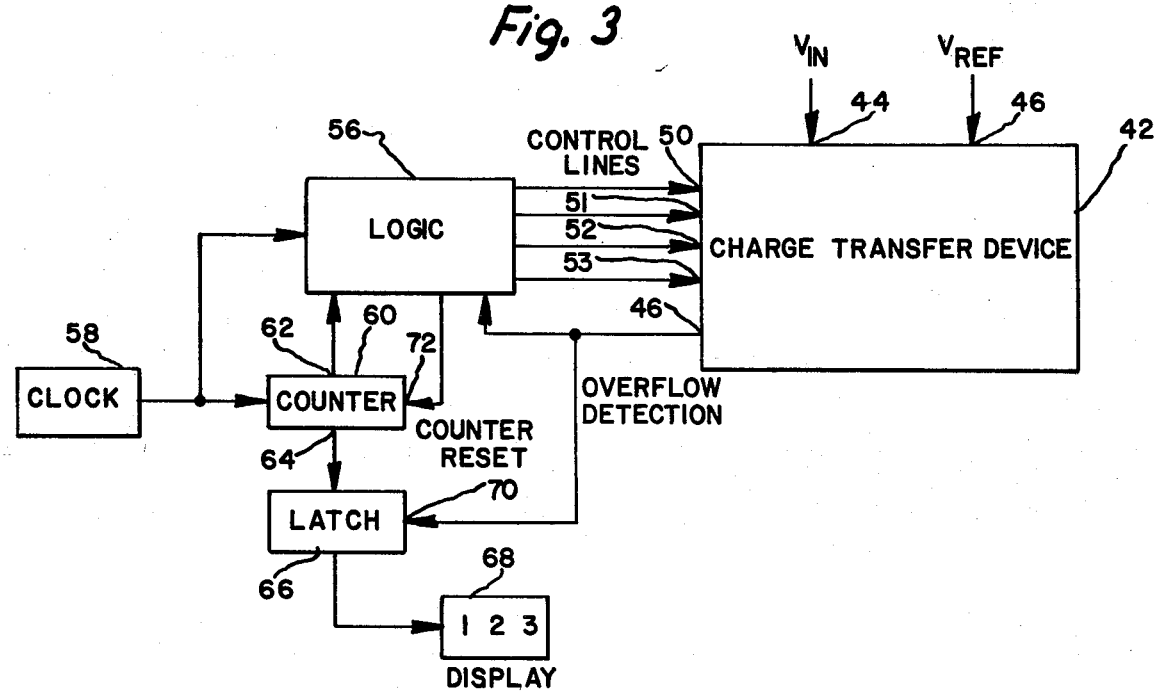
FIG. 3 is a block diagram of one embodiment of an analog-to-digital converter in accordance with this invention.

FIG. 3 is a block diagram of an analog-to-digital converter in accordance with this invention which incorporates the structure hereinabove described in conjunction with FIGS. 1 and 2. Logic circuit 56 provides the required φ1 through φ4 switching signals to charge transfer device 42. Charge transfer device 42 is intended to include not only the structure of FIG. 1 but also other structures as would be readily apparent to one skilled in the art for fulfilling the same functional requirements as, for example, those illustrated in FIGS. 4, 5 and 6. Charge transfer device 42 is provided with inputs 44 and 46 which provide the input and reference signals, respectively. Output 48 provides an indication when the threshold of threshold amplifier 32 is reached as was hereinbefore described. Inputs 50-53 provide signals for controlling φ1 through φ4. As was hereinbefore described, switches may be provided in conjunction with the circuit of FIG. 1 for connecting the various voltages to the various phases as was hereinbefore described, through the application of logic level signals thereto. It is to be understood that in accordance with this invention, all of the circuits of FIG. 3 may conveniently be provided on a single monolithic integrated circuit compatible with MOS fabrication techniques. Logic circuit 56 may conveniently include, for example, shift register circuits or the like for providing the appropriate sequence of phase control signals. Clock 58 is connected to logic circuit 56 and also to counter 60. In accordance with this invention and as has been hereinabove described to some extent, clock 58 need not provide an especially accurate or stable time base for the proper operation of an analog-to-digital converter in accordance with this invention. Clock 58 may therefore be selected to provide only more or less regular output signals which are, however, adapted to be counted by counter 60. Counter 60 includes two outputs a first output 62 connected to logic circuit 56 and a second output 64 connected to latch circuit 66. Latching circuit 66 is adapted to continuously store the last output of counter 60 and to apply the same to display 68 in response to input 70 from charge transfer device 42. Logic circuit 56 provides a reset signal to input 72 of counter 60 at the beginning of the reference portion of the measurement cycle.

As will be recalled from the discussion of FIGS. 1 and 2, a complete measurement cycle includes two portions, a first portion wherein charge proportional to $V_{in}$ is metered into storage a preselected number of times, and a second portion wherein charge proportional to $V_{ref}$ is metered out of storage until a preselected threshold is reached. It is preferred in accordance with this invention that the preselected number of counts in the first portion of the measurement cycle be selected in such a way that the number of transfers in the second portion of the conversion cycle be directly proportional to the input signal voltage. This may be readily accomplished by, for example, selecting a reference signal level two volts and a preselected number of counts equal to 200. Since the input signal voltage may be expressed as DISPLAYED COUNT = $V_{in}/V_{ref}$ × PRESELECTED COUNT it will be appreciated that output 64 of counter 60 will directly display 100 times the input voltage at the end of the conversion cycle. For example, a reading of 154 would indicate an input voltage of 1.54 volts. The resolution of an analog-to-digital converter in accordance with this invention is directly related to the maximum number of transfers required to reach the threshold level and a second portion of the conversion cycle. Where a high resolution is required, $V_{ref}$ should be selected to provide for the transfer of relatively small amounts of charge from the storage location during the second portion of the process. It is emphasized that $V_{ref}$ may not be a round number but, rather, may be any convenient value so long as the preselected number of charge transfers in the first portion of the conversion cycle is selected appropriately. For example, if $V_{ref}$ is, say, 1.87 volts and the preselected number of charge transfers is 187 the display will indicate the number of volts (× 100) directly. This may be clearly seen by referring again to FIG. 2 and assuming that $V_{ref}$ is equal to 4 volts and that $V_{in}$ is equal to 2 volts. The preselected number of charge transfers is selected to be 4 and it may be seen by reference to FIG. 2 that 2 cycles are required during the second portion of the conversion process (beginning at $t_{13}$) to reach the threshold voltage level. The voltage is therefore two volts. By proper selection of the reference voltage and the number of preselected cycles in the first portion of the transfer process, the output of the device, which is, in fact, a ratio, may quite readily be made to read directly in volts or other convenient units.

Figure 4:
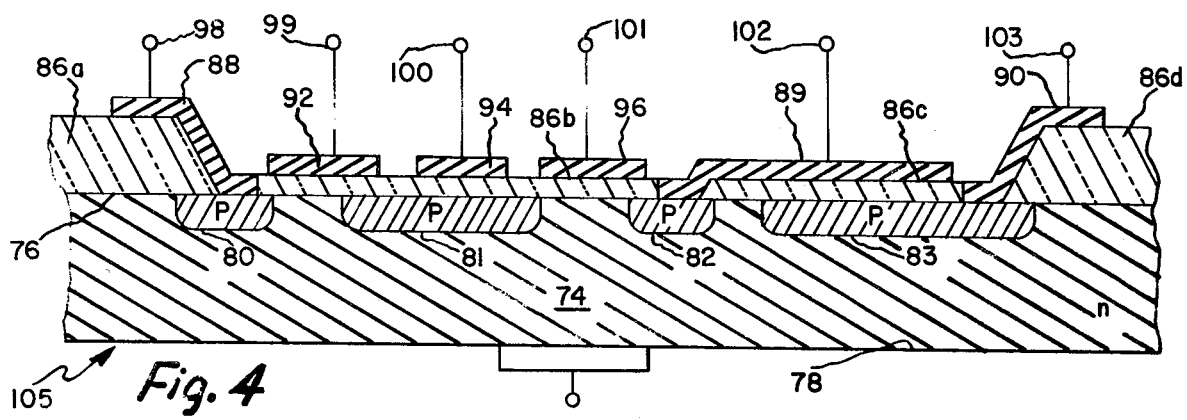
FIG. 4 is a section view of a particular MOS implementation of one embodiment of this invention.

FIG. 4 illustrates in a section view an exemplary monolithic embodiment of the circuit of FIG. 1. A semiconductor substrate 74 of a first conductivity type, as for example n-type, is provided having four impurity regions extending from a first surface 76 thereof down towards but not meeting a second surface 78. These regions, 80–83 may be formed by any convenient method, as for example by diffusion, by epitaxial growth, by ion implantation or by any other process as is well known to those skilled in the art. Regions 80–83 are of opposite conductivity type and in this exemplary embodiment are illustrated as p-type regions. As insulating oxide 86 overlies surface 76 of substrate 74 and is selectively thick or thin, being thick in regions 86a and 86d and thin in regions 86b and 86c. Dig down holes are provided to allow metallizations 88, 89 and 90 to ohmically contact p-type regions 80, 82 and 83, respectively. Metallizations 92, 94 and 96 insulatingly overlie surface 76. Metallizations 88, 92, 94, 96, 89 and 90 are provided with electrical contact terminals 98 through 103 for the application of the appropriate electrical potentials thereto. The device, illustrated generally at 105, may be considered generally as an MOS bucket-brigade implementation of the charge transfer portion of an analog-to-digital converter in accordance with this invention. It is emphasized that the device is in no way a delay line, but utilizes the type of construction commonly found in bucket brigade delay lines which are well known to those skilled in the art. Similar methods of fabrication may therefore be readily employed to conveniently construct device 105 in accordance with this invention. Charge transfer device 105 includes substantially all of the active devices of FIG. 1. Specifically, capacitor 22 is formed on device 105 by electrode 89 and p-type impurity region 83. Transistor 26 is formed by p-type impurity region 82, electrode 96 and p-type impurity region 81, Connection is made between the drain of transistor 26 and one terminal of capacitor 22 where electrode 89 contacts p-type impurity region 82 through the dig down hole. Capacitor 24 includes electrode 94 and p-type impurity region 81 while transistor 34 includes p-type impurity region 81, electrode 92 and p-type impurity region 80. Electrode 88 provides the drain connection for transistor 34. In operation, terminal 98 would be appropriately connected to the voltage illustrated at $\phi3$, terminal 99 to $\phi1$, terminal 100 to $\phi4$, terminal 101 to $\phi2$, terminal 102 to the input of threshold amplifier 32 and terminal 103 to ground.

Figure 5:
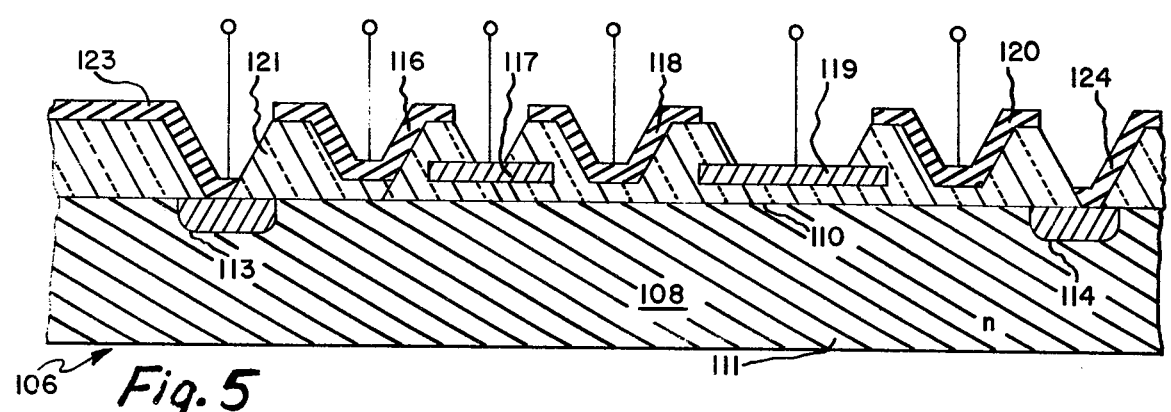
FIG. 5 is another MOS implementation of an embodiment of this invention.

The charge transfer portion of an analog-to-digital converter in accordance with this invention may readily be implemented in surface charge transfer form as well as in bucket brigade form. Device 106 illustrated in FIG. 5 is an exemplary embodiment of a surface charge transfer embodiment of this invention. A semiconductor substrate 108 of, for example, n-conductivity type is provided at a first and second major surfaces 110 and 111, impurity regions 113 and 114 extend from surface 110 into substrate 108 towards but not meeting surface 111. Regions 113 and 114 may conveniently be formed in the same manner as regions 80–83 of device 105.

Electrodes 116 through 120 are insulatingly disposed over surface 110 by insulating layer 121. Insulating layer 121 includes thick and thin portions as illustrated in order to provide for the insulating overlap of surface adjacent electrodes. Electrodes 123 and 124 provide ohmic contact to impurity regions 113 and 114 through dig down holes extending through insulating layer 121.

Figure 6:
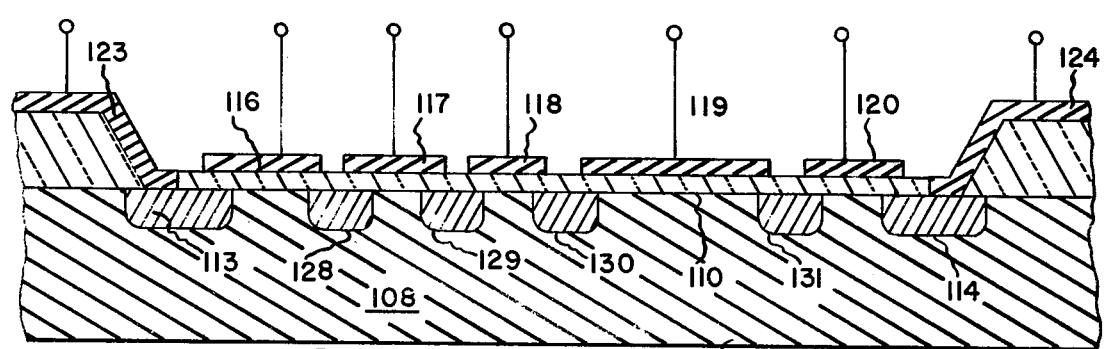
FIG. 6 is yet another MOS implementation of an embodiment of this invention.

Device 126 illustrated at FIG. 6 is an alternative implementation of device 106 illustrated in FIG. 5. A substrate 108 including first and second surfaces 110 and 111 and impurity regions 113 and 114 provide similar functions to like numbered elements in device 106. Electrodes 116 through 118 and 123 and 124 perform functions analogous to those of the like numbered electrodes in FIG. 5. Device 126, however, instead of providing overlapping electrodes as was the case in device 106, provides additional impurity regions 128 through 131 extending from surface 110 into semiconductor substrate 108 towards but not meeting surface 111. Impurity regions 128 through 131 provide for the transfer of charge between the surface adjacent charge storage locations underlying electrodes 116 through 120.

Figure 7:
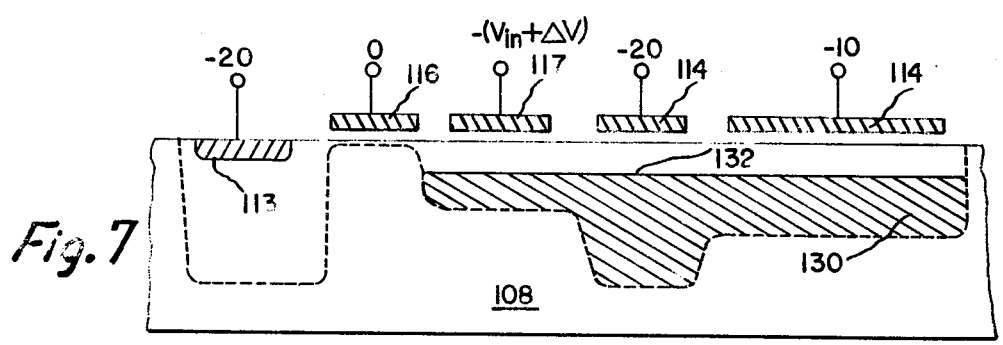
FIGS. 7 through 15 are schematic charge transfer diagrams illustrating the operation of a surface charge transfer implementation of this invention.
Figure 8:
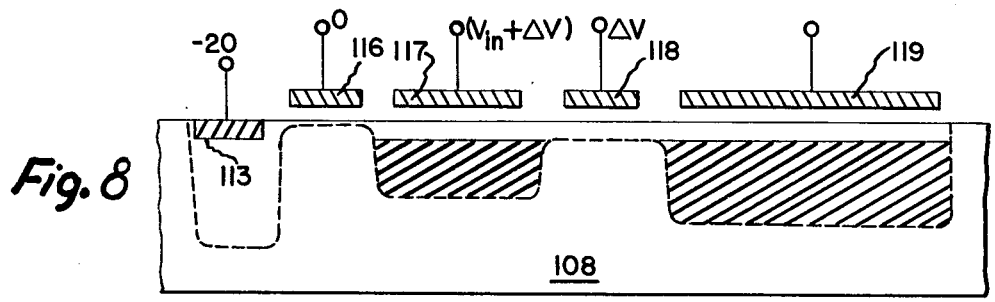
Figure 9:
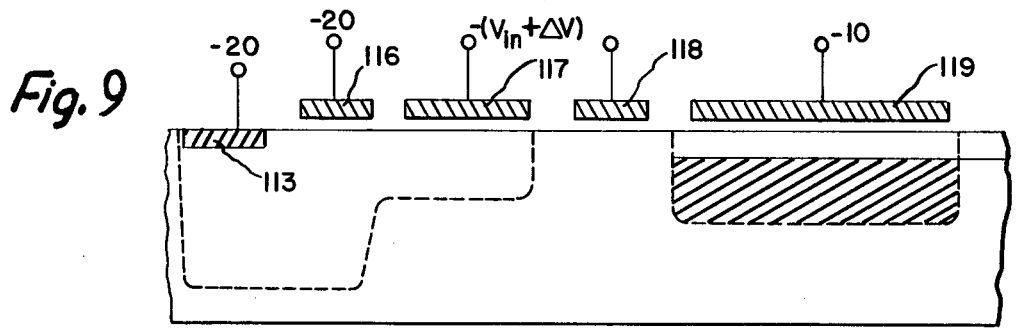

FIGS. 7-15 illustrate in conceptual form the charge transfer processes which occur in either of the surface charge transfer devices illustrated at FIGS. 5 or 6. FIGS. 8 through 15 are not structural diagrams, but rather indicate schematically the surface charge distribution underlying the electrodes of the devices illustrated in FIGS. 5 and 6. Varying potentials are illustrated as varying depth wells or reservoirs extending into the bulk of the substrate. It is to be understood that, in fact, charge is accumulated and transfers along the surface of the substrate and that the wells or reservoirs of FIGS. 8 through 15 are so illustrated for purposes of enabling the ready visualization of the charge transfer processes involved in accordance with this invention. The electrodes in FIGS. 8 through 15 are illustrated as overlying the surface of the semiconductor substrate and no insulation is shown thereunder. Phantom lines illustrate potential wells and shading within these potential wells illustrates the level of charge stored in the wells. An analogy to fluid transfer may readily be drawn in that charge will flow so as to equalize the level of potential in each of the potential wells except when barriers are created between wells. Each of FIGS. 8-13 illustrate the charge transfer processes which occur underlying electrodes 116 through 119 for example in FIGS. 5 and 6. The charge transfer processes occurring beneath electrodes 120 and impurity region 114 are separately illustrated in FIGS. 14 and 15. This division of the devices into two sections is done for the purpose of eliminating undue repetition and simplifying drawings for the purpose of ready comprehension. Referring now to FIG. 7, substrate 108 is illustrated having first impurity region 113 at one surface thereof and electrodes 116 through 119 disposed over that same surface. FIG. 7 illustrates the charge distribution in the device at the beginning of the first measurement stage. It will be recalled that since each measurement cycle concludes with a level of charge underlying electrode 119 which electrode may be analogized to capacitor 22 of FIG. 1, equal to the threshold level of threshold amplifier 32 that the succeeding cycle will start at that point. It is pointed out therefore that the first complete measurement cycle of an A to D converter in accordance with this invention must be utilized to establish this level, or other means must be utilized to establish the level. It is convenient in accordance with this invention, therefore, to disregard the reading obtained on the first measurement cycle and thereby provide for the establishment of the correct initial conditions. It will be recalled that during the first portion of the measurement cycle charge is removed from the first charge storage location, in this case the charge storage location underlying electrode 119 in an amount proportional to $V_{in}$ for a preselected number of transfers. FIGS. 7-9 illustrate this removal process. While exemplary voltages are illustrated as applied to the various electrodes, it is emphasized that these voltages are exemplary only and the actual voltages applied will vary depending on the geometry of the device and upon the other sundry characteristics such as impurity concentrations, spacings and so on. Therefore, it is preferred in accordance with this invention to utilize voltages which produce the relative potential distributions illustrated in FIGS. 7-15 rather than the exact voltages set forth. The potentials applied to electrodes 117, 118 and 119 in FIG. 7 form charge storage locations 130 thereunder which charge storage location is filled to a level 132 which is the threshold level of the device. The voltage applied to electrode 117 is $-(V_{in} + \Delta V)$ while $-20$ volts is applied electrode 118 and $-10$ volts to electrode 119. Referring now to FIG. 8 the voltage applied to electrode 118 is raised to $\Delta V$ volts while the voltages applied to the other electrodes are maintained at the levels of FIG. 7. The charge stored in the charge storage location underlying electrode 117 is proportional to the difference in surface potential beneath electrode 117 and electrode 118. This difference is seen to be $V_{in}$ volts and therefore charge is stored beneath electrode 117 proportional to $V_{in}$. Since all charge was previously stored beneath electrode 119 as will be seen charge has been transferred from beneath electrode 119 to beneath electrode 117 in an amount proportional to $V_{in}$. The potential applied to electrode 116 is now changed to $-20$ volts as illustrated in FIG. 9 and charge flows from beneath electrode 117 to beneath impurity region 113 which provides a substantially infinite sump for absorbing charge. The conditions illustrated at FIG. 7 are now restored, the charge stored beneath electrode 119 in FIG. 9 being distributed in the manner of FIG. 7 and the potential applied to electrode 116 changing to 0 volts to isolate this charge from the area underlying region 113. The steps illustrated in FIGS. 7-9 are repeated serially for the preselected number of charge transfers, the result being that charge is removed from the charge storage location underlying electrode 119 in an amount proportional to $V_{in}$ a preselected plurality of times. It is seen that, referring to FIG. 9 during the transfer of charge from beneath electrode 117 to region 113, the potential applied to electrode 118 is changed to zero volts to completely isolate the charge beneath electrode 119.

Referring now to FIGS. 10-13 the second stage of the conversion process in accordance with this invention is illustrated. Initially, charge is stored beneath electrode 119 in an amount which has resulted from the plurality of transfers illustrated in FIGS. 7-9.

Figure 10:
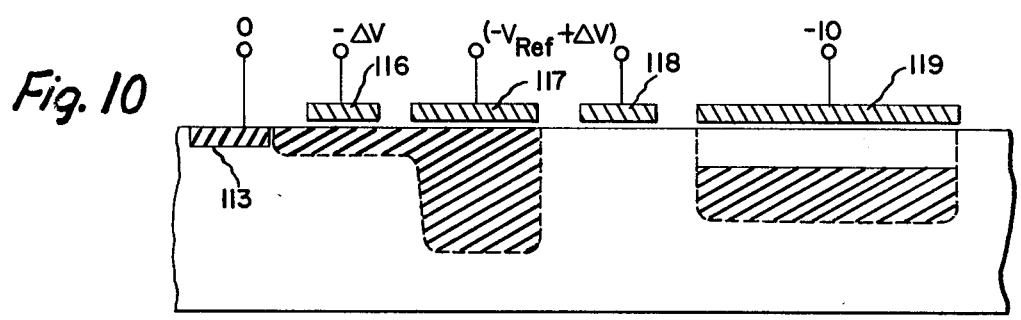
Figure 11:
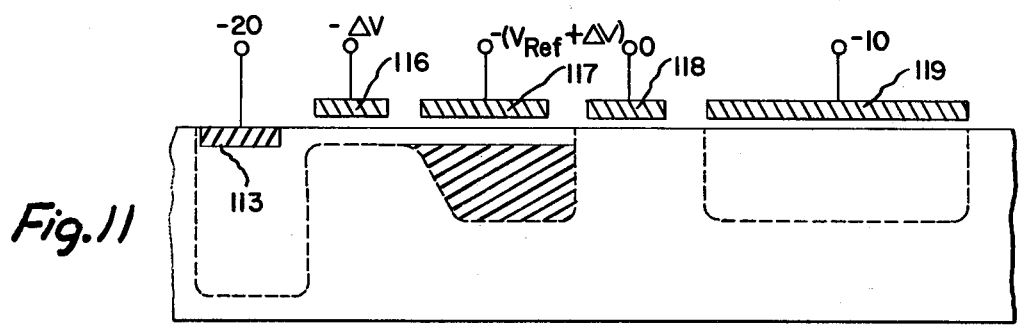
Figure 12:
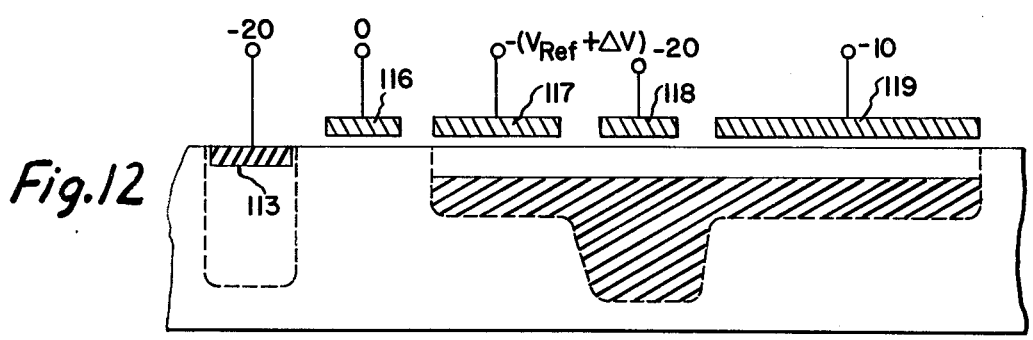
Figure 13:
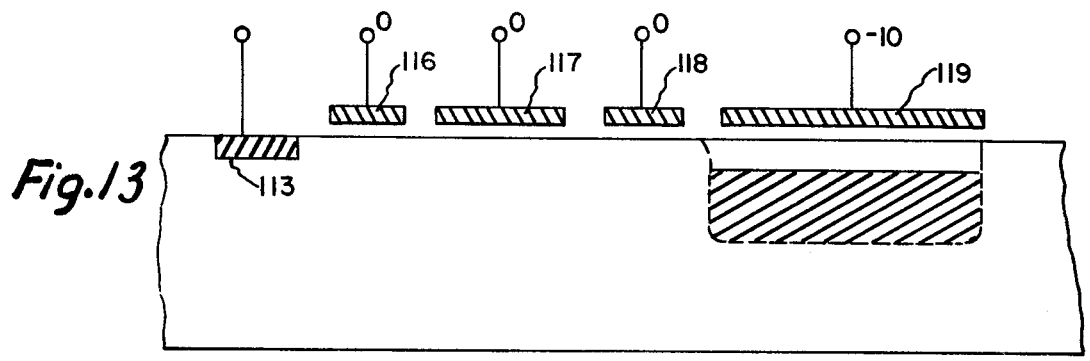

Referring now to FIG. 10, region 113 is connected to zero volts thus providing a substantially infinite source of charge. Electrode 116 is connected to V volts, electrode 117 to $-(V_{ref} + \Delta V)$ volts, electrode 118 to zero volts and electrode 119 to $-10$ volts. Charge is transferred into the charge storage location underlying electrodes 116 and 117 in an amount substantially filling the charge storage locations. The potential applied to region 113 is changed to 20 volts as illustrated in FIG. 11 and charge spills from the charge storage location underlying electrode 117 into the charge sump created underlying region 113. The charge stored beneath electrode 117 is now proportional to the difference in surface potentials beneath electrodes 116 and 117 or $V_{ref}$. The potential applied to electrode 118 is now changed to −20 volts and charge equilibrates in the charge storage location underlying electrodes 117, 118 and 119 as shown in FIG. 12. The potentials applied to electrodes 116, 117 and 118 are now all set equal to 0 volts and all of the charge stored beneath electrodes 117, 118 and 119 in FIG. 12 is transferred to the charge storage location beneath electrode 119 as illustrated in FIG. 13. A packet of charge proportional to the magnitude of $V_{ref}$ has been transferred into the charge storage location underlying electrode 119. The steps illustrated in FIGS. 10–13 are repeated until the level of charge in the charge storage location underlying electrode 119 is equal to the threshold level. The detection of this threshold level along with a method for establishing the initial level of charge beneath electrode 119 is illustrated in FIGS. 14 and 15.

Figure 14:
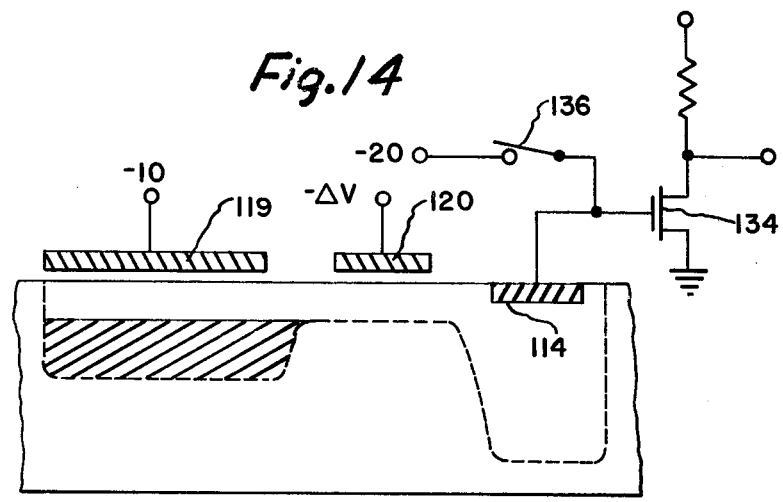
Figure 15:
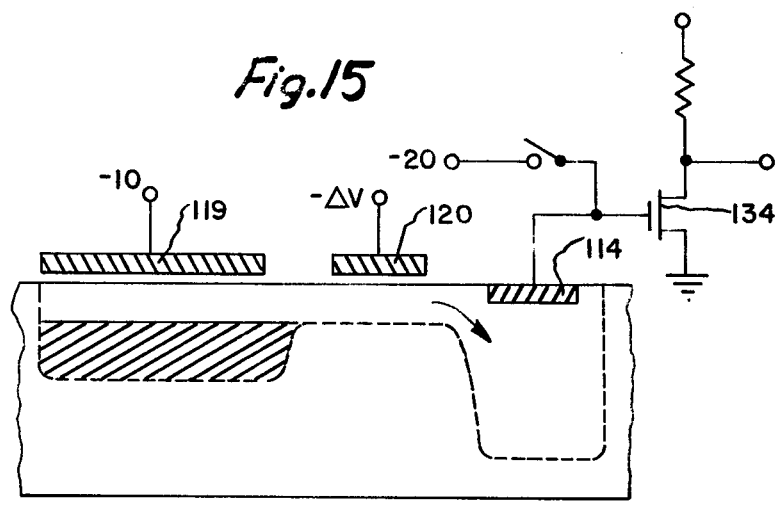

FIGS. 14 and 15 illustrate the charge transfers occurring beneath electrodes 119 and 120 and impurity region 114. As illustrated in FIGS. 14 and 15, a transistor 134 having its drain grounded, its gate connected to impurity region 114 and its source connected to an appropriate voltage is provided. The gate of transistor 134 is selectively connected to a source of −20 volts. Switch 136 is adapted to either connect region 114 to the −20 volts source or to allow region 114 to float. Referring specifically to FIG. 14, impurity region 114 is connected to −20 volts and a charge sump as was hereinbefore described in conjunction with region 113 is created beneath region 114, removing substantially all charge therefrom. Referring to FIG. 15, switch 136 is opened and region 114 is allowed to float. Charge exceeding the level of the barrier created beneath electrode 120 which flows into the charge storage location beneath region 114 is detected by transistor 134 which provides an appropriate indication thereof. Transistor 134 is shown connected as a simple amplifier, it being understood that any connection which will provide an indication of charge flowing into the charge storage location beneath region 114 may readily be employed as is well known to those skilled in the art.

A new and improved charge transfer analog-to-digital converter in accordance with this invention has been described including several alternative embodiments thereof. It is to be understood that certain modifications and changes will occur to those skilled in the art without departing from the true spirit and scope of this invention. For example, embodiments of this invention utilizing surface charge transfer devices have been described. It will be appreciated that these surface charge transfer devices may deviate somewhat from the specific embodiments illustrated, for example, buried channel devices may be utilized, devices having complementary impurity concentrations, for example, devices suited to the storage of electrons rather than holes and therefore being constructed on a p-type rather than an n-type semiconductor substrate and having n-type impurity regions therein. These and other modifications as will be obvious to those skilled in the art are intended to be included in the scope of the appended claims.

What is claimed is:

1. An analog to digital converter comprising:
    a first charge storage location;
    means for establishing a first charge level in said first charge storage location;
    means for removing a first metered plurality of charge packets from said first charge storage location, the size of the charge packets in said first plurality of charge packets being proportional to the magnitude of a first input signal;
    means for adding a second metered plurality of charge packets to said first charge storage location, the size of the charge packets in said second plurality proportional to the magnitude of a first reference voltage; and
    means for detecting the presence of said first charge level in said first charge storage location and providing an output signal in response thereto;
    the ratio between the number of charge packets in said first plurality to the number of charge packets in said second plurality at the time of said output signal being equal to the ratio between said first reference voltage and the magnitude of said first input signal.

2. The analog to digital converter of claim 1 wherein said first charge storage location comprises:
    a semiconductor substrate;
    first electrode means insulatingly overlying a first major surface of said substrate;
    second electrode means ohmically contacting said semiconductor substrate at a second major surface thereof;
    means for applying an electrical potential between said first and second electrodes for forming an electrical field therebetween so that a first charge storage location is formed underlying said first electrode means.

3. The analog to digital converter of claim 2 wherein said means for establishing a first charge level in said first charge storage location comprises:
    means for transferring charge into said first charge storage location; and
    means for stopping said transfer in response to said output signal.

4. The analog to digital converter of claim 3 wherein said means for transferring charge into said first charge storage location comprises:
    a first charge reservoir in said substrate;
    means for maintaining said reservoir in a substantially full condition,
    means for controlling the transfer of charge from said charge reservoir to said first charge storage location.

5. The analog to digital converter of claim 4 wherein said means for controlling the transfer of charge from said charge reservoir to said first charge storage location comprises:
    means for selectively erecting a potential barrier between said charge reservoir and said first charge storage location.

6. The analog to digital converter of claim 5 wherein said charge reservoir comprises third electrode means insulatingly overlying said substrate and means for applying an electrical potential between said second and third electrodes for forming an electrical field therebetween so that a second charge storage location is formed underlying said third electrode.

7. The analog to digital converter of claim 6 wherein said means for maintaining said reservoir in a substantially full condition comprises:
    a source of charge; and means for controlling the transfer of charge from said source of charge to said reservoir.

8. The analog to digital converter of claim 7 wherein said means for controlling the transfer of charge from said source of charge to said reservoir comprises:
   fourth electrode means overlying said semiconductor substrate; and
   means for applying an electrical potential between said fourth electrode means and said second electrode means for forming an electrical field therebetween so that an electrical barrier may be selectively formed underlying said fourth electrode.

9. The analog to digital converter of claim 1 wherein said means for removing a first metered plurality of charge packets from said first charge storage location comprises:
   a second charge storage location;
   means for varying the size of said second charge storage location in response to said magnitude of said first input signal;
   means for selectively connecting said first and second charge storage locations so that charge may be transferred from said first charge storage location to said second charge storage location in an amount proportional to the magnitude of said first input signal;
   means for emptying said second charge storage location after each transfer; and
   counting means for counting the number of transfers occurring.

10. The analog to digital converter of claim 9 wherein said second charge storage location comprises:
    fifth electrode means insulatingly overlying said semiconductor substrate; and
    means for applying an electrical potential between said fifth and second electrodes for forming an electrical field therebetween so that a charge storage location is formed underlying said fifth electrode.

11. The analog to digital converter of claim 10 wherein said means for varying the size of said second charge storage location comprises:
    means for varying the magnitude of said electrical potential in response to the magnitude of said first input signal.

12. The analog to digital converter of claim 10 wherein said electrical potential is said first input signal.

13. The analog to digital converter of claim 1 wherein said first charge storage location comprises:
    a semiconductor substrate of a first conductivity type having first and second major surfaces;
    a first semiconductor region of opposite conductivity type to said substrate, extending from said first surface into said substrate, towards but not meeting said second surface;
    first electrode means insulatingly overlying said first region; and
    second electrode means ohmically contacting said first region.

14. The analog to digital converter of claim 13 wherein said means for establishing a first charge level in said first charge storage location comprises:
    means for transferring charge into said first charge storage location; and
    means for stopping said transfer in response to said output signal.

15. The analog to digital converter of claim 14 wherein said means for transferring charge into said first charge storage location comprises:
    means for selectively applying a voltage between said first and second electrodes.

16. The analog to digital converter of claim 15 wherein said means for removing a first metered plurality of charge packets from said first charge storage location comprises:
    a second charge storage location;
    means for varying the amount of charge in said second charge storage location in response to said magnitude of said first input signal;
    means for selectively connecting said first and second charge storage locations so that charge may be transferred from said first charge storage location to said second charge storage location in an amount proportional to the magnitude of said first input signal;
    means for emptying said second charge storage location after each transfer; and
    counting means for counting the number of transfers occurring.

17. The analog to digital converter of claim 16 wherein said second charge storage location comprises:
    a second semiconductor region of opposite conductivity type to said substrate extending from said first surface into said substrate, towards but not meeting said second surface;
    third electrode means insulatingly overlying said second region;
    forth electrode means ohmically contacting said second semiconductor region.

18. The analog to digital converter of claim 17 wherein said means for varying the amount of charge in said second charge storage location comprises:
    means for applying adjustable electrical potential to said third and fourth electrodes, said adjustable potential being proportional to said input voltage.

* * * * *